United States Patent
Lei et al.

(10) Patent No.: US 12,313,702 B2
(45) Date of Patent: May 27, 2025

(54) SWITCH IDENTIFICATION CIRCUIT AND ELECTRIC DEVICE

(71) Applicant: SHENZHEN CARKU TECHNOLOGY CO., LIMITED, Guangdong (CN)

(72) Inventors: Yun Lei, Guangdong (CN); Zhifeng Zhang, Guangdong (CN); Jianping Lin, Guangdong (CN)

(73) Assignee: SHENZHEN CARKU TECHNOLOGY CO., LIMITED, Shenzhen (CN)

(*) Notice: Subject to any disclaimer, the term of this patent is extended or adjusted under 35 U.S.C. 154(b) by 250 days.

(21) Appl. No.: 18/089,648

(22) Filed: Dec. 28, 2022

(65) Prior Publication Data

US 2023/0133107 A1 May 4, 2023

Related U.S. Application Data

(63) Continuation of application No. PCT/CN2020/103039, filed on Jul. 20, 2020.

(30) Foreign Application Priority Data

Jun. 29, 2020 (CN) .......................... 202010605067.3
Jun. 29, 2020 (CN) .......................... 202021246478.X

(51) Int. Cl.
*G01R 31/67* (2020.01)
*G01R 31/00* (2006.01)
(Continued)

(52) U.S. Cl.
CPC .......... *G01R 31/67* (2020.01); *G01R 31/006* (2013.01); *G01R 31/52* (2020.01); *H02H 7/222* (2013.01)

(58) Field of Classification Search
CPC ...... G01R 31/67; G01R 31/52; G01R 31/006; H02H 7/222
See application file for complete search history.

(56) References Cited

U.S. PATENT DOCUMENTS 7,800,870 B2 * 9/2010 Matsumoto .............. H02H 9/08
361/18
2002/0093360 A1 7/2002 Nagata
(Continued)

FOREIGN PATENT DOCUMENTS

CN 101335449 A 12/2008
CN 201966576 U 9/2011
(Continued)

OTHER PUBLICATIONS

The extended European search report issued in corresponding EP application No. 20942748.3 dated Jan. 31, 2024.
(Continued)

*Primary Examiner* — Jared Fureman
*Assistant Examiner* — Samantha L Faubert
(74) *Attorney, Agent, or Firm* — HAUPTMAN HAM, LLP

(57) ABSTRACT

A switch identification circuit is provided. The switch identification circuit includes a detecting unit, a control unit, a connection unit, a first connection terminal, and a second connection terminal. The detecting unit is coupled with the first connection terminal and the second connection terminal, and configured to detect voltages at the two connection terminals to output a detection signal. The connection unit is electrically coupled with a power-supply device configured to provide a driving voltage to the two connection terminals. The control unit is coupled with the detecting unit and the connection unit, and configured to determine whether the first connection terminal and the second connection terminal are short-circuited according to the detection signal. If the
(Continued)

two connection terminals are short-circuited, the control unit is configured to output a connection-enabling signal to the connection unit, to make the connection unit control the power-supply device to stop supplying the driving voltage.

20 Claims, 5 Drawing Sheets

(51) Int. Cl.
*G01R 31/52* (2020.01)
*H02H 7/22* (2006.01)

(56) References Cited

U.S. PATENT DOCUMENTS

| | | | | |
|---|---|---|---|---|
| 2004/0239403 | A1* | 12/2004 | Farley | H03K 17/687 327/437 |
| 2010/0327948 | A1* | 12/2010 | Nisbet | H03K 17/687 327/436 |
| 2023/0006666 | A1* | 1/2023 | Liu | H03K 17/14 |

FOREIGN PATENT DOCUMENTS

| | | |
|---|---|---|
| CN | 203658552 U | 6/2014 |
| CN | 207215949 U | 4/2018 |
| CN | 110687439 A | 1/2020 |
| CN | 110783997 A | 2/2020 |
| JP | 2005024452 A | 1/2005 |
| JP | 2012084443 A | 4/2012 |
| JP | 2015087217 A | 5/2015 |
| KR | 20070064851 A | 6/2007 |
| KR | 20110116805 A | 10/2011 |
| KR | 20120000053 U | 1/2012 |

OTHER PUBLICATIONS

The first office action issued in corresponding CA application No. 3,126,465 dated Mar. 3, 2023.
WIPO, International Search Report and Written Opinion for International Application No. PCT/CN2020/103039, Mar. 31, 2021.

* cited by examiner

SWITCH IDENTIFICATION CIRCUIT AND ELECTRIC DEVICE

CROSS-REFERENCE TO RELATED APPLICATION(S)

This application is a continuation of International Application No. PCT/CN2020/103039, filed on Jul. 20, 2020, which claims priority to Chinese Patent Application No. 202010605067.3, filed on Jun. 29, 2020, and claims priority to Chinese Patent Application No. 202021246478.X, filed on Jun. 29, 2020 the disclosures of which are hereby incorporated by reference in their entireties.

TECHNICAL FIELD

This disclosure relates to the field of circuits, and particularly to a switch identification circuit and an electric device.

BACKGROUND

When a car is started, a power-supply device of the car outputs a power signal to a starter motor of the car, so that the starter motor can complete ignition to start the car. In this process, a switch identification circuit is required to identify a connection state of a load to ensure that a car engine can start stably and safely.

At present, most of the existing switch identification circuits determine whether the connection state of the load meets a starting requirement of the car by identifying an electrical signal of the load by means of a triode or an optocoupler identification detection circuit. However, the triode or the optocoupler identification detection circuit can pass charges when a minimum turn-on voltage is reached, which makes the switch identification circuit unable to identify a short-circuited state, resulting in relatively low car safety during car starting.

SUMMARY

Implementations of the disclosure provide a switch identification circuit. The switch identification circuit includes a detecting unit, a control unit, a connection unit, a first connection terminal, and a second connection terminal. The detecting unit is electrically coupled with the first connection terminal and the second connection terminal, and is configured to detect a voltage at the first connection terminal and a voltage at the second connection terminal to output a detection signal. The control unit is electrically coupled with the detecting unit and the connection unit, and is configured to receive the detection signal and determine whether the first connection terminal and the second connection terminal are short-circuited according to the detection signal, where a power-supply device is configured to supply a driving voltage to the first connection terminal and the second connection terminal. The control unit is configured to output a connection-enabling signal to the connection unit on condition that the first connection terminal and the second connection terminal are short-circuited, to make the connection unit control the power-supply device to stop supplying the driving voltage.

Implementations of the disclosure provide an electric device. The electric device includes a power-supply device, a load, and the above switch identification circuit. The power-supply device is electrically coupled with the load and configured to drive the load to start when the power-supply device and the load form a conductive loop. The switch identification circuit is electrically coupled with the power-supply device, and the switch identification circuit is configured to form a conductive loop comprising the power-supply device and the load when under action of the connection-enabling signal, the connection unit of the switch identification circuit controls the power-supply device to supply the driving voltage to the first connection terminal and the second connection terminal.

BRIEF DESCRIPTION OF THE DRAWINGS

In order to describe technical solutions of implementations of the disclosure more clearly, the following will give a brief description of accompanying drawings used for describing the implementations. Apparently, accompanying drawings described below are merely some implementations. Those of ordinary skill in the art can also obtain other accompanying drawings based on the accompanying drawings described below without creative efforts.

DETAILED DESCRIPTION

Figure 1:
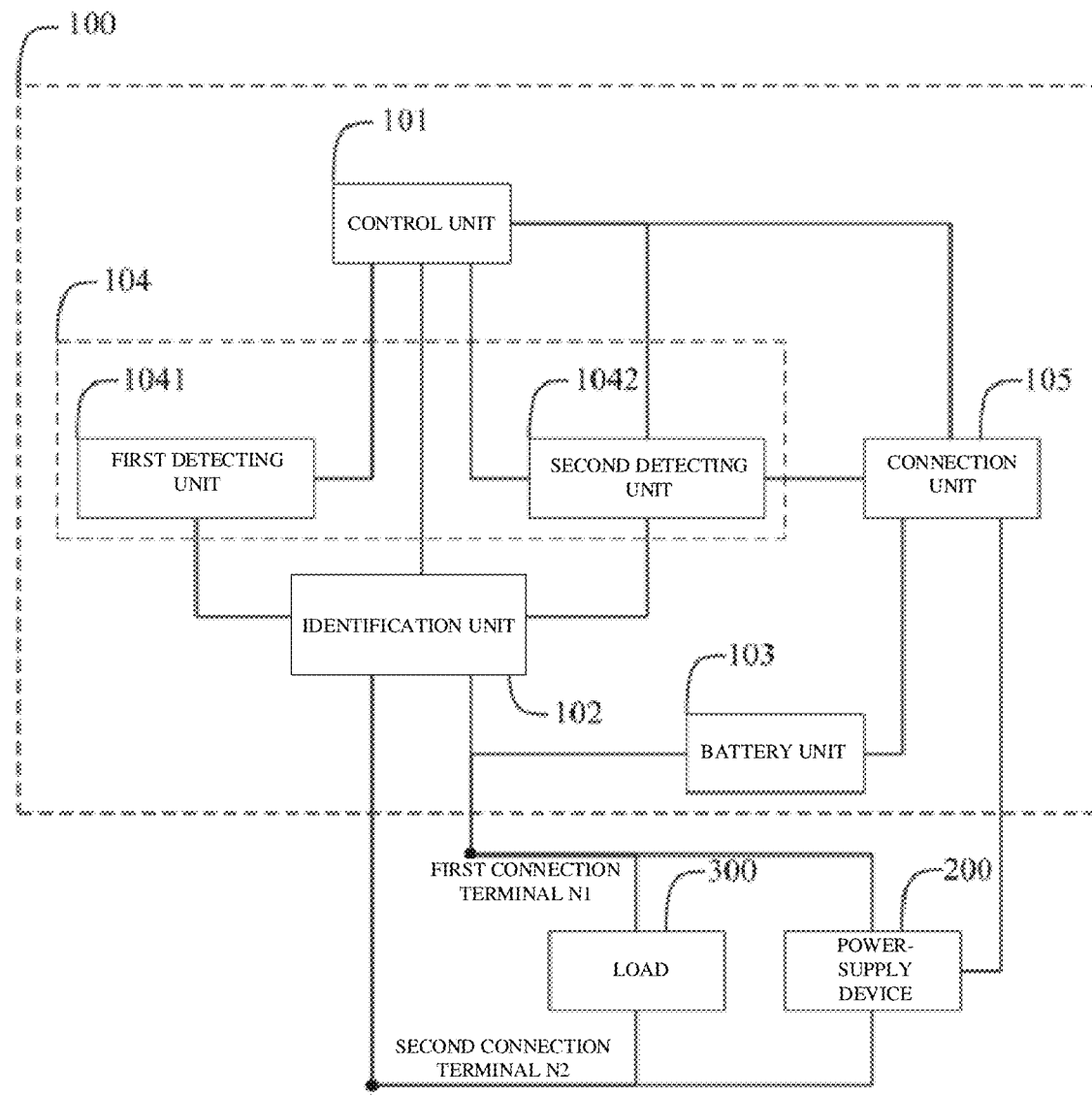
FIG. 1 is a schematic structural diagram illustrating a switch identification circuit according to implementations.

Hereinafter, technical solutions of implementations of the disclosure will be described in a clear and comprehensive manner with reference to accompanying drawings intended for the implementations. It is evident that the implementations described herein constitute merely some rather than all implementations of the disclosure, and that those of ordinary skill in the art will be able to derive other implementations based on these implementations without making creative efforts, which all such derived implementations shall all fall in the protection scope of the disclosure.

When a car is started, a battery of the car outputs a power signal to a starter motor of the car, so that the starter motor can complete ignition to start according to the power signal. If a battery failure or a failure of a connection between the battery and the starter motor occur, normal starting of the starter motor will be affected, which reduces safety of car starting.

To this end, it is necessary to detect the battery and the connection between the battery and the starter motor before the car is started, to improve the safety of the car during starting.

In implementations of the disclosure, a switch identification circuit is provided, which can detect the operation of a power-supply device (equipped with a battery) and a connection manner between the power-supply device and a load (equipped with a starter motor) before the car is started. As such, the load can be activated when the operation of the power-supply device and the connection between the power-supply device and the load meet a starting requirement.

In implementations of the disclosure, a switch identification circuit is provided. The switch identification circuit includes a detecting unit, a control unit, a connection unit, a first connection terminal, and a second connection terminal. The detecting unit is electrically coupled with the first connection terminal and the second connection terminal, and is configured to detect a voltage at the first connection terminal and a voltage at the second connection terminal to output a detection signal. The control unit is electrically coupled with the detecting unit and the connection unit, and is configured to receive the detection signal and determine whether the first connection terminal and the second connection terminal are short-circuited according to the detection signal, wherein a power-supply device is configured to supply a driving voltage to the first connection terminal and the second connection terminal. The control unit is configured to output a connection-enabling signal to the connection unit on condition that the first connection terminal and the second connection terminal are short-circuited, to make the connection unit control the power-supply device to stop supplying the driving voltage.

In implementations of the disclosure, an electric device is provided. The electric device includes a power-supply device, a load, and the above switch identification circuit. The power-supply device is electrically coupled with the load and configured to drive the load to start when the power-supply device and the load form a conductive loop. The switch identification circuit is electrically coupled with the power-supply device, and the switch identification circuit is configured to form a conductive loop comprising the power-supply device and the load when under action of the connection-enabling signal, the connection unit of the switch identification circuit controls the power-supply device to supply the driving voltage to the first connection terminal and the second connection terminal.

Compared to the related art, the switch identification circuit of the implementations of the disclosure can control the power-supply device to stop supplying the driving voltage to load when the first identification terminal and the second identification terminal are short-circuited directly or indirectly by detecting the voltage at the first connection terminal and the voltage at the second connection terminal. It can be seen that, compared to a detection method by means of a triode or an optocoupler identification detection circuit, the switch identification circuit of the disclosure can accurately identify whether the first connection terminal and the second connection terminal are short-circuited (i.e., a dangerous state). In this way, safety of the load coupled between the first connection terminal and the second connection terminal during starting of the load can be improved.

FIG. 1 is a schematic structural diagram illustrating a switch identification circuit according to implementations. As illustrated in FIG. 1, a switch identification circuit 100 includes a control unit 101, an identification unit 102, a battery unit 103, a detecting unit 104, and a connection unit 105.

The control unit 101 is electrically coupled with the identification unit 102. The control unit 101 is configured to output an identification-enabling signal to the identification unit 102, to make the identification unit 102 enter an identification state under control of a first level of the identification-enabling signal, and to make the identification unit 102 exit the identification state under control of a second level of the identification-enabling signal.

The identification unit 102 is electrically coupled with a first connection terminal N1 and a second connection terminal N2. The identification unit 102 is configured to receive a voltage at the first connection terminal N1 as a first identification signal to transmit the first identification signal to the detecting unit 104, and receive a voltage at the second connection terminal N2 as a second identification signal to transmit the second identification signal to the detecting unit 104. The first connection terminal N1 is electrically coupled with positive poles of a power-supply device 200 and a load 300, and the second connection terminal N2 is electrically coupled with negative poles of the power-supply device 200 and the load 300, where the power-supply device 200 is configured to drive the load 300 to start and operate.

The detecting unit 104 includes a first detecting unit 1041 and a second detecting unit 1042. The first detecting unit 1041 is electrically coupled with the control unit 101. The first detecting unit 1041 is configured to receive the first identification signal outputted by the identification unit 102, and perform voltage division processing on the first identification signal to output a first detection signal to the control unit 101. The voltage division process referred to herein means that the first identification signal is converted into the first detection signal that satisfies a voltage division relationship of the first detecting unit 1041, where the voltage division relationship is determined by resistance values and a connection relationship of specified resistors of the first detecting unit 1041. The second detecting unit 1042 is electrically coupled with the control unit 101. The second detecting unit 1042 is configured to receive the second identification signal outputted by the identification unit 102, and perform voltage division processing on the second identification signal to output a second detection signal to the control unit 101.

The control unit 101 is configured to receive the first detection signal and the second detection signal, obtain a detection difference by performing a difference operation on the first detection signal and the second detection signal, and output a connection-enabling signal to the second detecting unit 1042 and the connection unit 105 after comparing the detection difference with a detection threshold.

In some implementations, the control unit 101 is further configured to calculate a value of the first identification signal according to a voltage division relationship between the first detection signal and the first identification signal. Similarly, a value of the second identification signal can be obtained. The control unit 101 is configured to perform a difference operation on the obtained first identification signal and the obtained second identification signal, assign a result of the difference operation as an identification difference, and output the connection-enabling signal to the second detecting unit 1042 and the connection unit 105 after comparing the identification difference with an identification threshold.

In implementations of the disclosure, if the detection difference is greater than the detection threshold, the control unit 101 is configured to output a second level of the identification-enabling signal, to make the identification unit 102 exit an identification state, and output a first level of the connection-enabling signal to the second detecting unit 1042 and the connection unit 105, to make the second detecting unit 1042 enter a current detection state and make the connection unit 105 enter a turned-on state.

In implementations of the disclosure, if the detection difference is less than the detection threshold, the control unit 101 is configured to continue to output a first level of the identification-enabling signal, to make the identification unit 102 remain in the identification state, and output a second level of the connection-enabling signal to the second detecting unit 1042 and the connection unit 105, to make the second detecting unit 1042 remain in a voltage detection state and make the connection unit 105 enter a turned-off state.

Specifically, if the detection difference is zero, a voltage at a first identification terminal S1 is the same as a voltage at a second identification terminal S2, which means that the first identification terminal S1 and the second identification terminal S2 are short-circuited. In this case, the control unit 101 outputs the second level of the connection-enabling signal to the connection unit 105, to make the connection unit 105 be in the turned-off state. If the detection difference is a negative value, the voltage at the first identification terminal S1 is less than the voltage at the second identification terminal S2, which indicates that the first identification terminal S1 is coupled with the second connection terminal N2 and the second identification terminal S2 is coupled with the first connection terminal N1. In this case, the control unit 101 outputs the second level of the connection-enabling signal to the connection unit 105, to make the connection unit 105 be in the turned-off state. If the detection difference is a positive value and less than the detection threshold, which indicates that the power-supply device 200 is in a low-voltage state. In this case, the control unit 101 outputs the second level of the connection-enabling signal to the connection unit 105, to make the connection unit 105 be in the turned-off state.

The connection unit 105 is electrically coupled with the control unit 101. The connection unit 105 is configured to receive the connection-enabling signal outputted by the control unit 101, and enter the turned-on state under action of the first level of the connection-enabling signal and enter the turned-off state under action of the second level of the connection-enabling signal.

The connection unit 105 is further electrically coupled with the power-supply device 200. The connection unit 105 is configured to form a conductive loop including the power-supply device 200, the load 300, and the connection unit 105 when the connection unit 105 is in the turned-on state. In this case, the power-supply device 200 can output a power signal to the load 300 to realize starting of the load 300. The connection unit 105 is further configured to disconnect the conductive loop including the power-supply device 200, the load 300, and the connection unit 105 when the connection unit 105 is in the turned-off state. In this way, the load 300 cannot be started.

The battery unit 103 is electrically coupled with the first connection terminal N1. The battery unit 103 is configured to maintain the voltage at the first connection terminal N1, such that a voltage difference between the first connection terminal N1 and the second connection terminal N2 is maintained when no power-supply device 200 is connected, to cooperate with the identification unit 102 to complete identification of the voltage at the first connection terminal N1 and the voltage at the second connection terminal N2 when the identification unit 102 in the identification state.

The connection unit 105 is further electrically coupled with the battery unit 103. The connection unit 105 is configured to form a conductive loop including the battery unit 103, the load 300, and the connection unit 105 when the connection unit 105 is in the turned-on state and no power-supply device 200 is connected. In this case, the battery unit 103 can output a battery power to load 300 to start the load 300.

The connection unit 105 is further electrically coupled with the second detecting unit 1042. The connection unit 105 is configured to form a conductive loop including the power-supply device 200, the load 300, and the connection unit 105 to output a current signal to the second detecting unit 1042 in the case that the second detecting unit 1042 enters the current detection state and the connection unit 105 enters the turned-on state when the control unit 101 outputs the first level of the connection-enabling signal, and the second detecting unit 1042 is configured to output the current signal to the control unit 101.

The control unit 101 is further configured to receive the current signal outputted by the second detecting unit 1042, and adjust the connection-enabling signal (outputted to the second detecting unit 1042 and the connection unit 105) to the second level of the connection-enabling signal from the first level the connection-enabling signal after the current signal exceeds a current threshold. In this case, the connection unit 105 enters the turned-off state. As a result, the conductive loop including the power-supply device 200, the load 300, and the connection unit 105 is disconnected, and so the load 300 stops operating.

In implementations of the disclosure, the switch identification circuit 100 is configured to identify a state of the power-supply device 200 and a state of a connection between the power-supply device 200 and the load 300 (hereinafter, a connection state for short) through cooperation of the identification unit 102 and the battery unit 103. When the state of the power-supply device 200 and the connection state meet a starting requirement, the control unit 101 is configured to output the first level of the connection-enabling signal to the connection unit 105 to make the connection unit 105 enter the turned-on state. In this case, the power-supply device 200 electrically coupled with the connection unit 105 can form a conductive loop with the load 300 and output a power signal to the load 300, so as to start the load 300.

In implementations of the disclosure, the state of the power-supply device 200 includes a standard-voltage state, a low-voltage state, and a missing state (i.e., a state where no power-supply device is connected). The connection state includes a positive-connection state, a reverse-connection state, and a short-circuited state. The starting requirement refers to that the connection state is the positive-connection state and the power-supply device 200 is in the standard-voltage state or the missing state.

In implementations of the disclosure, the control unit 101 may be a microcontroller unit (MCU), a field programmable gate array (FPGA), or other integrated circuits capable of controlling subsequent units, which is not limited in the disclosure.

Figure 2:
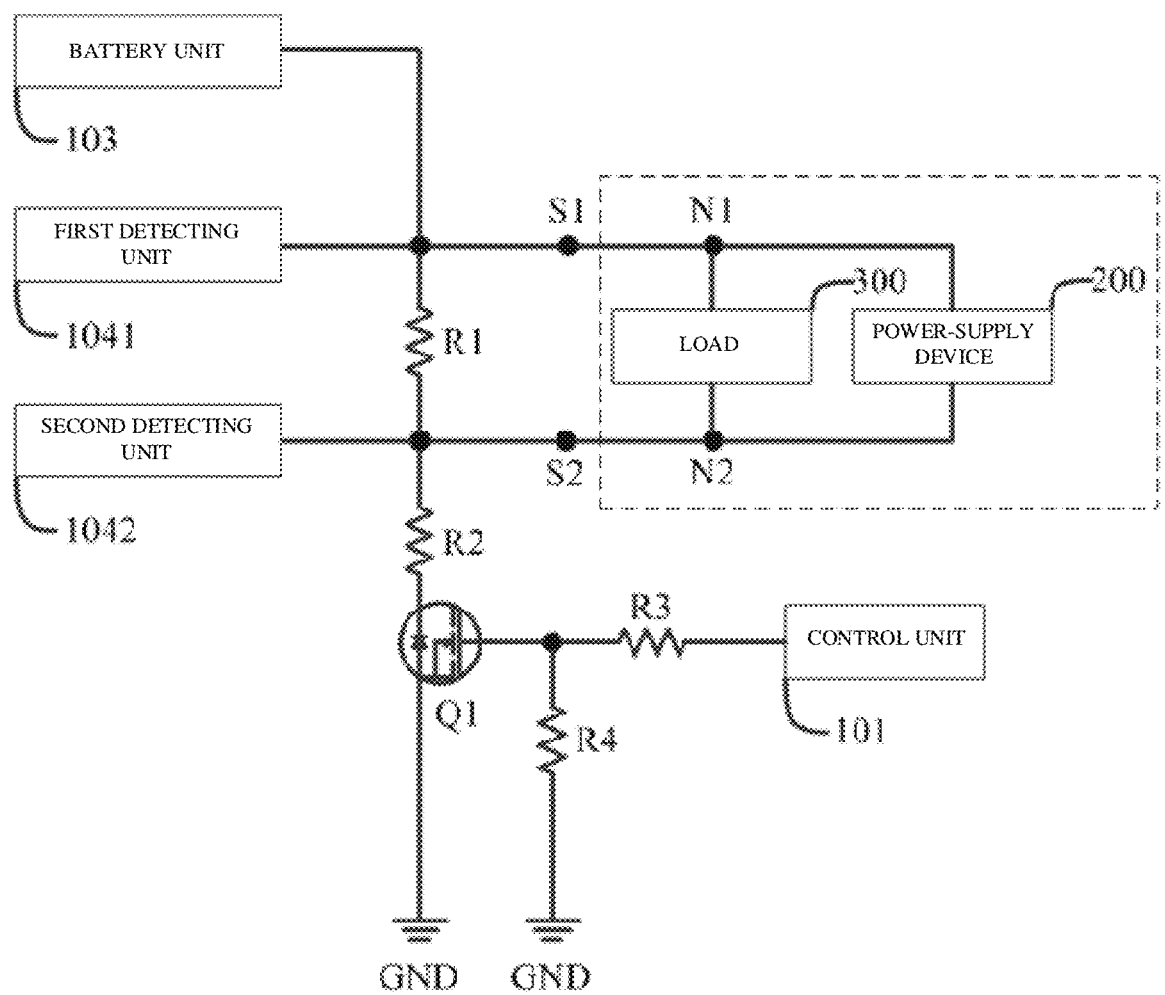
FIG. 2 is a schematic structural diagram illustrating a detailed circuit of an identification unit of the switch identification circuit illustrated in FIG. 1 according to implementations.

FIG. 2 is a schematic structural diagram illustrating a detailed circuit of an identification unit of the switch identification circuit illustrated in FIG. 1 according to implementations. As illustrated in FIG. 2, the identification unit 102 includes a first identification terminal S1, a second identification terminal S2, and a first transistor Q1.

The first identification terminal S1 is electrically coupled with the first connection terminal N1. The second identification terminal S2 is electrically coupled with the second connection terminal N2. The power-supply device 200 and the load 300 are coupled between the first connection terminal N1 and the second connection terminal N2, where the power-supply device 200 is connected in parallel across the load 300.

The first detecting unit 1041 is electrically coupled with the first identification terminal S1, and is configured to receive a voltage (signal) at the first identification terminal S1 as the first identification signal. The second detecting unit 1042 is electrically coupled with the second identification terminal S2, and is configured to receive a voltage (signal) at the second identification terminal S2 as the second identification signal.

The first identification terminal S1 is further electrically coupled with the battery unit 103, and is configured to receive an identification voltage signal outputted by the battery unit 103, which allows existence of a level difference (also called as a voltage difference) between the first identification terminal S1 and the second identification terminal S2 when no power-supply device 200 is connected.

A first resistor R1 is electrically coupled between the first identification terminal S1 and the second identification terminal S2. The first resistor R1 has a resistance value in a range of 100 and 200 kiloohms, and in this case, a current flowing through the first resistor R1 is so small to be negligible, that is, regarded as an open circuit.

A drain of the first transistor Q1 is electrically coupled with the second identification terminal S2 via a second resistor R2, a source of the first transistor Q1 is electrically coupled with the ground terminal GND, a gate of the first transistor Q1 is electrically coupled with an identification-enabling signal output terminal of the control unit 101 (not illustrated) via a third resistor R3, and the gate of the first transistor Q1 is further electrically coupled with the ground terminal GND via a fourth resistor R4.

A voltage value of the first level of the identification-enabling signal outputted by the control unit 101 is 5V for example, since the third resistor R3 has a resistance value much smaller than a resistance value of the fourth resistor R4, a voltage value inputted to the gate of the first transistor Q1 after being divided by the fourth resistor R4 is slightly less than 5V, and accordingly, turning on of the first transistor Q1 is not affected. In addition, since the gate of the first transistor Q1 is electrically coupled with the ground terminal GND via the fourth resistor R4, residual charges at the gate of the first transistor Q1 can be pulled down when the identification-enabling signal is switched to the second level of the identification-enabling signal from the first level the identification-enabling signal, which can increase the speed at which the first transistor Q1 enters the turned-off state compared to natural depletion of the residual charges.

In implementations of the disclosure, the first transistor Q1 is turned on under action of the first level of the identification-enabling signal outputted by the control unit 101, and accordingly, the identification unit 102 enters the identification state. That is, after the first transistor Q1 is turned on, a conductive loop including the first identification terminal S1, the second identification terminal S2, the second resistor R2, the turned-on first transistor Q1, and the ground terminal GND is formed, and accordingly, the first detecting unit 1041 and the second detecting unit 1042 can receive potential signals at the first identification terminal S1 and the second identification terminal S2. Then the control unit 101 can determine, according to the potential signals, the state of the power-supply device 200 and a state of a connection between two identification terminals and two connection terminals.

In implementations of the disclosure, the state of the power-supply device 200 includes a standard-voltage state, a low-voltage state, and a missing state. The state of the connection between the two identification terminals and the two connection terminals includes a positive-connection state, a reverse-connection state, and a short-circuited state.

The positive-connection state herein refers to that the first identification terminal S1 is coupled with the first connection terminal N1, and the second identification terminal S2 is coupled with the second connection terminal N2. Furthermore, in the case that the power-supply device 200 is connected, whether a voltage value in the power-supply device 200 is a standard voltage or a low voltage can be determined according to a voltage difference between a voltage at the first identification terminal S1 and a voltage at the second identification terminal S2. Specifically, if the voltage difference is lower than a voltage threshold, which indicates a positive-connection and low-voltage state. If the voltage difference is higher than the voltage threshold, which indicates a positive-connection and standard-voltage state. In the case that no power-supply device 200 is connected, the load 300 is equivalent to a resistor connected between the first identification terminal S1 and the second identification terminal S2, and is used as a voltage dividing resistor together with the second resistor R2, which indicates a positive-connection state with power supply. In this case, under action of an identification voltage outputted by the battery unit 103, the voltage difference between the voltage at the first identification terminal S1 and the voltage at the second identification terminal S2 can still meet a requirement of the control unit 101, and so the connection unit 105 enters the turned-on state.

The reverse-connection state herein refers to that the first identification terminal S1 is coupled with the second connection terminal N2, and the second identification terminal S2 is coupled with the first connection terminal N1. In the case that the power-supply device 200 is connected, no matter if the power-supply device is in the standard-voltage state or the low-voltage state, the voltage at the second identification terminal S2 is significantly greater than the voltage at the first identification terminal S1. In the case that no power-supply device 200 is connected, the load 300 is equivalent to a resistor connected between the first identification terminal S1 and the second identification terminal S2, so that the voltage at the first identification terminal S1 is the same as the voltage at the second identification terminal S2, which indicates a short-circuited state.

The short-circuited state herein refers to that the first identification terminal S1 is directly connected to the second identification terminal S2, so that the voltage at the first identification terminal S1 is the same as the voltage at the second identification terminal S2, which indicates another short-circuited state.

Based on the states of the power-supply device 200 and the states of the connection of the two identification terminals and the two connection terminals, the switch identification circuit 100 can detect, with the first detecting unit 1041, the voltage at the first identification terminal S1 and detect, with the second detecting unit 1042, the voltage at the second identification terminal S2, to identify a short circuited state including a reverse-connection state without power supply and a short-circuited state, a failure state including a reverse-connection state with power supply and a positive-connection and low-voltage state, and a standard state including the positive-connection and standard-voltage state and a positive-connection state without power supply. In a case of the standard state, the control unit 101 controls the connection unit 105 to enter the turned-on state.

Figure 3:
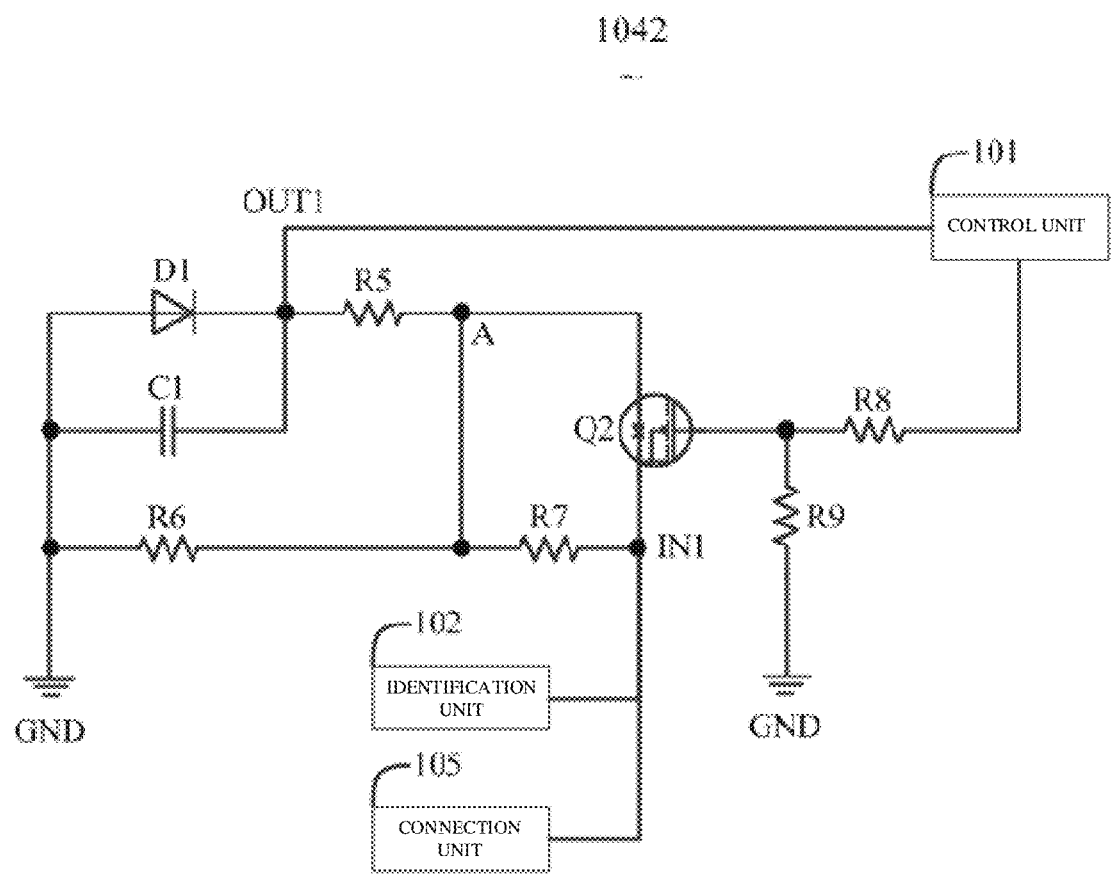
FIG. 3 is a schematic structural diagram illustrating a detailed circuit of a second detecting unit of the switch identification circuit illustrated in FIG. 1 according to implementations.

FIG. 3 is a schematic structural diagram illustrating a detailed circuit of a second detecting unit of the switch identification circuit illustrated in FIG. 1 according to implementations. As illustrated in FIG. 3, the second detecting unit 1042 includes a first input terminal IN1, a first output terminal OUT1, a Zener diode D1, a capacitor C1, and a second transistor Q2.

An anode of the zener diode D1 is electrically coupled with the ground terminal GND. A cathode of the zener diode D1 is electrically coupled with the first output terminal OUT1. The first output terminal OUT1 is electrically coupled with a signal receiving terminal of the control unit 101. The first output terminal OUT1 is configured to output a first detection signal when the second detecting unit 1042 does not enter a current detection state, and is further configured to output a current signal when the second detecting unit 1042 enters the current detection state.

A fifth resistor R5 is electrically coupled between a voltage dividing node A and the first output terminal OUT1. A sixth resistor R6 is electrically coupled between the voltage dividing node A and the ground terminal GND. A seventh resistor R7 is electrically coupled between the voltage dividing node A and the first input terminal IN1. The first input terminal IN1 is electrically coupled with the identification unit 102 and the connection unit 105, and is configured to receive a second identification signal and a current signal.

The capacitor C1 is electrically coupled between the ground terminal GND and the first output terminal OUT1.

A source of the second transistor Q2 is electrically coupled with the first input terminal IN1. A drain of the second transistor Q2 is electrically coupled with the voltage dividing node A. A gate of the second transistor Q2 is electrically coupled with a connection-enabling signal output terminal of the control unit 101 (not illustrated) via an eighth resistor R8. The gate of the second transistor Q2 is further electrically coupled with the ground terminal GND via a ninth resistor R9.

In implementations of the disclosure, when the identification unit 102 is in the identification state under action of the first level of the identification-enabling signal outputted by the control unit 101, the second transistor Q2 is in the turned-off state due to receiving the second level of the connection-enabling signal outputted by the control unit 101, that is, the second detecting unit 1042 is in the voltage detection state in this case. The first input terminal IN1 receives the first identification signal outputted by the identification unit 102, and the second detecting unit 1042 performs voltage division processing on the first identification signal to output the first detection signal to the control unit 101 via the first output terminal OUT1, where the voltage division relationship between the first identification signal and the first detection signal is determined based on the resistance values and the connection relationship of the fifth resistor R5, the sixth resistor R6, and the seventh resistor R7. Then the control unit 101 obtains the detection difference by performing the difference operation on the received first detection signal and the received second detection signal, and compares the detection difference with the detection threshold. In the case that the detection difference is greater than the detection threshold, the control unit 101 adjusts the connection-enabling signal (outputted to the gate of the second transistor Q2 and the connection unit 105) to the first level from the second level, to make the connection unit 105 and the second transistor Q2 of the second detecting unit 1042 be turned on. At this time, the identification unit 102 exits the identification state under action of the identification-enabling signal outputted by the control unit 101, to stop outputting the first identification signal, and at this time, the first input terminal IN1 receives the current signal outputted by the connection unit 105.

In implementations of the disclosure, the first detecting unit 1041 has a circuit structure similar to the second detecting unit 1042. Compared to the second detecting unit 1042, the first detecting unit 1041 has no transistor with a same function as the second transistor Q2 in the second detecting unit 1042 which is configured to switch between the voltage detection state and the current detection state, and accordingly, the first detecting unit 1041 can only output the second detection signal to the control unit 101 after performing voltage dividing processing on the received second identification signal.

Figure 4:
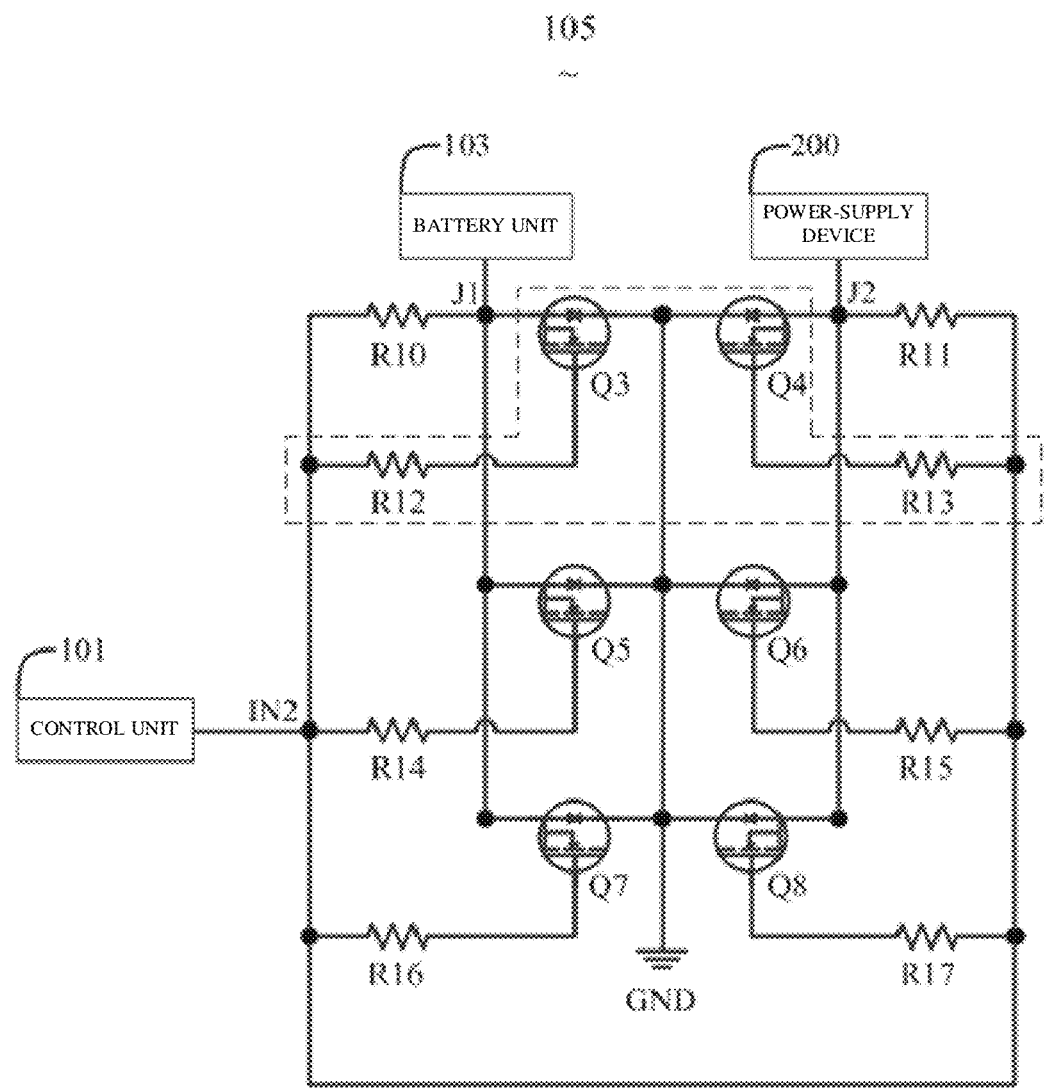
FIG. 4 is a schematic structural diagram illustrating a detailed circuit of a connection unit of the switch identification circuit illustrated in FIG. 1 according to implementations.

FIG. 4 is a schematic structural diagram illustrating a detailed circuit of a connection unit of the switch identification circuit illustrated in FIG. 1 according to implementations. As illustrated in FIG. 4, the connection unit 105 includes a first loop terminal J1, a second loop terminal J2, a second input terminal IN2, and multiple connection subunits.

The second input terminal IN2 is electrically coupled with the control unit 101. The second input terminal IN2 is configured to receive a connection-enabling signal outputted by the control unit 101, where the connection-enabling signal allows to control the multiple connection subunits of the connection unit 105 to be turned on or turned off. In the disclosure, the connection unit 105 is turned on when the multiple connection subunits are turned on, and the connection unit 105 is turned off when the multiple connection subunits are turned off.

The first loop terminal J1 is electrically coupled with the battery unit 103. The first loop terminal J1 allows the battery unit 103 and the load 300 to form a conductive loop when the multiple connection subunits are in the turned-on state, so that the load 300 can receive a battery signal outputted by the battery unit 103 to start.

The second loop terminal J2 is electrically coupled with the power-supply device 200. The second loop terminal J2 allows the power-supply device 200 and the load 300 to form a conductive loop when the multiple connection subunits are in the turned-on state, so that the load 300 can receive a power signal outputted by the power-supply device 200 to start.

Each of the multiple connection subunits is electrically coupled between the first loop terminal J1 and the second loop terminal J2.

The multiple connection subunits have similar structures. Hereinafter, the structure of each connection subunit is described in detail, in which one of the connection subunits of the disclosure is taken as an example.

The connection subunit includes a third transistor Q3 and a fourth transistor Q4. A gate of the third transistor Q3 is electrically coupled with the second input terminal IN2 via a twelfth resistor R12. A source of the third transistor Q3 is electrically coupled with the first loop terminal J1. A drain of the third transistor Q3 is electrically coupled with the ground terminal GND. A gate of the fourth transistor Q4 is electrically coupled with the second input terminal IN2 via a thirteenth resistor R13. A source of the fourth transistor Q4 is electrically coupled with the second loop terminal J2. A drain of the fourth transistor Q4 is electrically coupled with the ground terminal GND.

In implementations of the disclosure, the connection unit 105 includes three connection subunits. The three connection subunits operate in parallel, that is, if one of the three connection subunits is damaged, the other connection subunits can still operate. Moreover, the three connection subunits operating in parallel can improve a current transmission capability of the connection unit 105. The number of the connection subunits of the connection unit 105 can be increased or decreased according to actual needs, which is not limited in the disclosure.

In implementations of the disclosure, both the battery unit 103 coupled with the first loop terminal J1 and the power-supply device 200 coupled with the second loop terminal can be configured to start the load 300 when a conductive loop including the load 300 is formed. That is, in the disclosure, even if no power-supply device 200 including a battery device is connected in the car, the load 300 can be successfully started under action of the battery unit 103 of the switch identification circuit 100.

In implementations of the disclosure, the connection unit 105 is switched between the turned-on state and the turned-off state under action of the connection-enabling signal inputted via the second input terminal IN2. Specifically, if the connection unit 105 receives the first level of the connection-enabling signal, transistors of the connection unit 105 are turned on, that is, the multiple connection subunits enter the turned-on state. Accordingly, a conductive loop is formed between the battery unit 103 electrically coupled with the first loop terminal J1 and the load 300 and a conductive loop is formed between the power-supply device 200 electrically coupled with the second loop terminal J2 and the load 300, to start the load 300. If the connection unit 105 receives the second level of the connection-enabling signal, the transistors of the connection unit 105 are turned off, that is, the multiple connection subunits enter the turned-off state. Accordingly, no conductive loop is formed between the battery unit 103 electrically coupled with the first loop terminal J1 and the load 300, and no conductive loop is formed between the power-supply device 200 electrically coupled with the second loop terminal J2 and the load 300. As a result, the load 300 stops operating.

Compared to the related art, the switch identification circuit 100 of the implementations of the disclosure can control the power-supply device 200 to stop supplying the driving voltage to load 300 when the first identification terminal S1 and the second identification terminal S2 are short-circuited directly or indirectly, by detecting the voltage at the first connection terminal N1 and the voltage at the second connection terminal N2. It can be seen that, compared to a detection method by means of a triode or an optocoupler identification detection circuit, the switch identification circuit 100 of the disclosure can accurately identify whether the first connection terminal and the second connection terminal are short-circuited (i.e., a dangerous state). In this way, safety of the load 300 coupled between the first connection terminal and the second connection terminal during starting of the load can be improved.

Figure 5:
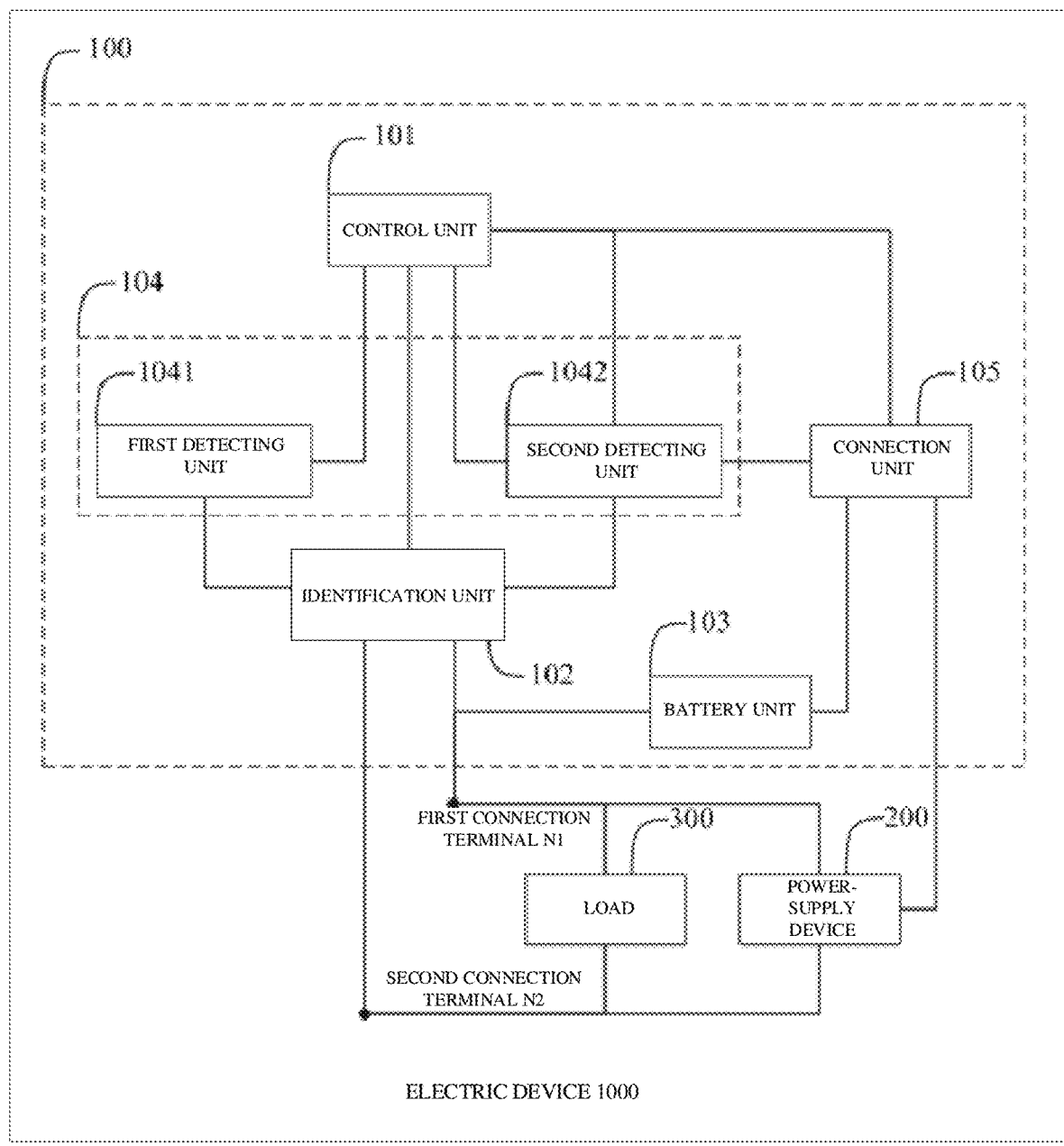
FIG. 5 is a schematic structural diagram illustrating an electronic device according to implementations.

In implementations of the disclosure, an electric device 1000 is provided. As illustrated in FIG. 5, the electric device 1000 includes a power-supply device 200, a load 300, and the foregoing switch identification circuit 100. The power-supply device is electrically coupled with the load and configured to drive the load to start when the power-supply device and the load form a conductive loop. The switch identification circuit is electrically coupled with the power-supply device, and the switch identification circuit is configured to form a conductive loop comprising the power-supply device and the load when under action of the connection-enabling signal, the connection unit of the switch identification circuit controls the power-supply device to supply the driving voltage to the first connection terminal and the second connection terminal.

The switch identification circuit and the electric device of the implementations of the disclosure have been described in detail above. While the principles and implementations of the disclosure have been described in connection with illustrative implementations, it is to be understood that foregoing implementations are only used to help understand the method and core idea of the disclosure. As will occur to those skilled in the art, the disclosure is susceptible to various modifications and changes without departing from the spirit and principle of the disclosure. Therefore, the disclosure is not limited to the disclosed implementations.

What is claimed is:

1. A switch identification circuit, comprising a detecting unit, a control unit, a connection unit, a first connection terminal, and a second connection terminal, wherein the detecting unit comprises a first detecting unit electrically coupled with the first connection terminal and a second detecting unit electrically coupled with the second connection terminal, and the detecting unit is configured to output a detection signal by detecting a voltage at the first connection terminal through the first detecting unit and detecting a voltage at the second connection terminal through the second detecting unit;

the control unit is electrically coupled with the first detecting unit, the second detecting unit, and the connection unit, and is configured to receive the detection signal and determine whether the first connection terminal and the second connection terminal are short-circuited according to the detection signal;

a power-supply device is configured to supply a driving voltage to the first connection terminal and the second connection terminal;

the control unit is configured to output a connection-enabling signal to the connection unit on condition that the first connection terminal and the second connection terminal are short-circuited, to make the connection unit control the power-supply device to stop supplying the driving voltage; and the second detecting unit comprises a first input terminal, a first output terminal, a Zener diode, a capacitor, and a second transistor, wherein an anode of the Zener diode is electrically coupled with a ground terminal, and a cathode of the Zener diode is electrically coupled with the first output terminal;

the first output terminal is electrically coupled with the control unit, and is configured to output a first detection signal before the second detecting unit enters a current detection state and output a current signal when the second detecting unit enters the current detection state;

the capacitor is electrically coupled between the ground terminal and the first output terminal;

a fifth resistor is electrically coupled between a voltage dividing node and the first output terminal, a sixth resistor is electrically coupled between the voltage dividing node and the ground terminal, and a seventh resistor is electrically coupled between the voltage dividing node and the first input terminal;

the first input terminal is electrically coupled with an identification unit of the switch identification circuit and the connection unit and configured to receive a second identification signal and the current signal; and a source of the second transistor is electrically coupled with the first input terminal, a drain of the second transistor is electrically coupled with the voltage dividing node, and a gate of the second transistor is electrically connected with the control unit via an eighth resistor.

2. The switch identification circuit of claim 1, wherein the detection signal comprises the first detection signal and a second detection signal;
wherein the detecting unit is configured to output the first detection signal by detecting the voltage at the first connection terminal, and output the second detection signal by detecting the voltage at the second connection terminal; and
wherein the control unit configured to receive the detection signal and determine whether the first connection terminal and the second connection terminal are short-circuited according to the detection signal is configured to:
receive the first detection signal and the second detection signal, and determine whether the first connection terminal and the second connection terminal are short-circuited according to the first detection signal and the second detection signal.

3. The switch identification circuit of claim 2, wherein the control unit configured to determine, according to the first detection signal and the second detection signal, whether the first connection terminal and the second connection terminal are short-circuited is configured to:
obtain a detection difference by performing a difference operation on the first detection signal and the second detection signal; and
determine that the first connection terminal and the second connection terminal are short-circuited on condition that the detection difference is zero, and output the connection-enabling signal to the connection unit, to make the connection unit control the power-supply device to stop supplying the driving voltage.

4. The switch identification circuit of claim 3, wherein the control unit is further configured to:
determine that the first connection terminal and the second connection terminal are connected reversely on condition that the detection difference is a negative value, and output the connection-enabling signal to the connection unit, to make the connection unit control the power-supply device to stop supplying the driving voltage;
determine that the power-supply device is in a low-voltage state on condition that the detection difference is a positive value and less than a detection threshold, and output the connection-enabling signal to the connection unit, to make the connection unit control the power-supply device to stop supplying the driving voltage; and
output the connection-enabling signal to the connection unit on condition that the detection difference is a positive value and greater than the detection threshold, to make the connection unit control the power-supply device to supply the driving voltage to the first connection terminal and the second connection terminal.

5. The switch identification circuit of claim 1, wherein the detecting unit is further electrically coupled with the connection unit electrically coupled with the power-supply device, and is configured to receive the current signal outputted by the connection unit and transmit the current signal to the control unit, when the connection unit controls the power-supply device to supply the driving voltage to the first connection terminal and the second connection terminal, wherein the current signal is a current used for the power-supply device to drive a load to start running, wherein the load is electrically coupled with the first connection terminal and the second connection terminal; and
the control unit is configured to receive the current signal, compare the current signal with a current threshold, and output the connection-enabling signal to the connection unit according to a comparison result, wherein the connection-enabling signal allows to control the connection unit to control the power-supply device to supply or stop supplying the driving voltage.

6. The switch identification circuit of claim 5, wherein the control unit configured to compare the current signal with the current threshold and output the connection-enabling signal to the connection unit according to the comparison result is configured to:
compare the current signal with the current threshold;
output the connection-enabling signal to the connection unit on condition that the current signal is less than the current threshold, wherein the connection unit is configured to control, according to the connection-enabling signal, the power-supply device to supply the driving voltage; and
output the connection-enabling signal to the connection unit on condition that the current signal is greater than or equal to the current threshold, wherein the connection unit is configured to control, according to the connection-enabling signal, the power-supply device to stop supplying the driving voltage.

7. The switch identification circuit of claim 1, wherein
the first detecting unit is configured to receive the voltage at the first connection terminal as a first identification signal, and configured to process and output the first detection signal to the control unit;
the second detecting unit is configured to receive the voltage at the second connection terminal as the second identification signal, and configured to process and output a second detection signal to the control unit; and
the second detecting unit is electrically coupled with the connection unit, and is configured to receive the current signal outputted by the connection unit and output the current signal to the control unit, when the connection unit controls the power-supply device to supply the driving voltage to the first connection terminal and the second connection terminal.

8. The switch identification circuit of claim 1, wherein
the first input terminal is configured to receive the current signal on condition that the second transistor is turned on under control of the connection-enabling signal; the first input terminal is configured to receive the second identification signal on condition that the second transistor is turned off under control of the connection-enabling signal.

9. The switch identification circuit of claim 1, further comprising a battery unit, wherein
the battery unit is electrically coupled with the first connection terminal, and is configured to maintain the voltage at the first connection terminal such that there is a voltage difference between the voltage at the first connection terminal and the voltage at the second connection terminal; and
the battery unit is further electrically coupled with the connection unit, and is configured to output or stop outputting the driving voltage to the first connection terminal and the second connection terminal, under control of the connection unit.

10. The switch identification circuit of claim 1, wherein the identification unit is electrically coupled with the first connection terminal and the second connection terminal, and is configured to provide a conductive loop when the first connection terminal and the second connection terminal are short-circuited.

11. The switch identification circuit of claim 10, further comprising a battery unit, wherein the detecting unit comprises a first detecting unit and a second detecting unit, wherein the identification unit comprises a first identification terminal, a second identification terminal, and a first transistor, wherein
the first identification terminal is electrically coupled with the first connection terminal, and the second identification terminal is electrically coupled with the second connection terminal;
the first detecting unit is electrically coupled with the first identification terminal and configured to receive the voltage at the first identification terminal as a first identification signal; the second detecting unit is electrically coupled with the second identification terminal and configured to receive the voltage at the second identification terminal as the second identification signal;
the battery unit is electrically coupled with the first identification terminal and allows existence of a voltage difference between the first identification terminal and the second identification terminal when no power-supply device is connected;
a first resistor is electrically coupled between the first identification terminal and the second identification terminal; and
a drain of the first transistor is electrically coupled with the second identification terminal via a second resistor, a source of the first transistor is electrically coupled with the ground terminal, and a gate of the first transistor is electrically coupled with the control unit via a third resistor, wherein
the first identification terminal, the second identification terminal, the second resistor, the turned-on first transistor, and the ground terminal form the conductive loop, on condition that the first transistor is turned on under control of an identification-enabling signal outputted by the control unit.

12. The switch identification circuit of claim 1, further comprising a battery unit, wherein the connection unit comprises a first loop terminal, a second loop terminal, a second input terminal, and a plurality of connection subunits, wherein
the second input terminal is electrically coupled with the control unit and configured to receive the connection-enabling signal outputted by the control unit, wherein the connection-enabling signal allows to control the plurality of connection subunits to be turned on or turned off;
each of the plurality of connection subunits is electrically coupled between the first loop terminal and the second loop terminal;
the first loop terminal is electrically coupled with the battery unit, and the battery unit is configured to supply a voltage signal to a conductive loop formed by the first connection terminal and the second connection terminal when the plurality of connection subunits are in a turned-on state; and
the second loop terminal is electrically coupled with the power-supply device, and the power-supply device is configured to supply the driving voltage to the conductive loop formed by the first connection terminal and the second connection terminal when the plurality of connection subunits are in the turned-on state.

13. An electric device, comprising:
a load;
a power-supply device, electrically coupled with the load, and configured to drive the load to start when the power-supply device and the load form a conductive loop; and
a switch identification circuit, electrically coupled with the power-supply device, and comprising a detecting unit, a control unit, a connection unit, a first connection terminal, and a second connection terminal, wherein
the detecting unit comprises a first detecting unit electrically coupled with the first connection terminal and a second detecting unit electrically coupled with the second connection terminal, and the detecting unit is configured to output a detection signal by detecting a voltage at the first connection terminal through the first detecting unit and detecting a voltage at the second connection terminal through the second detecting unit;
the control unit is electrically coupled with the first detecting unit, the second detecting unit, and the connection unit, and is configured to receive the detection signal and determine whether the first connection terminal and the second connection terminal are short-circuited according to the detection signal;
the power-supply device is configured to supply a driving voltage to the first connection terminal and the second connection terminal;
the control unit is configured to output a connection-enabling signal to the connection unit on condition that the first connection terminal and the second connection terminal are short-circuited, to make the connection unit control the power-supply device to stop supplying the driving voltage; and
wherein the second detecting unit comprises a first input terminal, a first output terminal, a Zener diode, a capacitor, and a second transistor, wherein
an anode of the Zener diode is electrically coupled with a ground terminal, and a cathode of the Zener diode is electrically coupled with the first output terminal; the first output terminal is electrically coupled with the control unit, and is configured to output a first detection signal before the second detecting unit enters a current detection state and output a current signal when the second detecting unit enters the current detection state;
the capacitor is electrically coupled between the ground terminal and the first output terminal;
a fifth resistor is electrically coupled between a voltage dividing node and the first output terminal, a sixth resistor is electrically coupled between the voltage dividing node and the ground terminal, and a seventh resistor is electrically coupled between the voltage dividing node and the first input terminal; the first input terminal is electrically coupled with an identification unit of the switch identification circuit and the connection unit and configured to receive a second identification signal and the current signal; and
a source of the second transistor is electrically coupled with the first input terminal, a drain of the second transistor is electrically coupled with the voltage dividing node, and a gate of the second transistor is electrically connected with the control unit via an eighth resistor.

14. The electric device of claim 13, wherein the detection signal comprises the first detection signal and a second detection signal;
wherein the detecting unit is configured to output the first detection signal by detecting the voltage at the first connection terminal, and output the second detection signal by detecting the voltage at the second connection terminal; and
wherein the control unit configured to receive the detection signal and determine whether the first connection terminal and the second connection terminal are short-circuited according to the detection signal is configured to:
receive the first detection signal and the second detection signal, and determine whether the first connection terminal and the second connection terminal are short-circuited according to the first detection signal and the second detection signal.

15. The electric device of claim 14, wherein the control unit configured to determine, according to the first detection signal and the second detection signal, whether the first connection terminal and the second connection terminal are short-circuited is configured to:
obtain a detection difference by performing a difference operation on the first detection signal and the second detection signal; and
determine that the first connection terminal and the second connection terminal are short-circuited on condition that the detection difference is zero, and output the connection-enabling signal to the connection unit, to make the connection unit control the power-supply device to stop supplying the driving voltage.

16. The electric device of claim 15, wherein the control unit is further configured to:
determine that the first connection terminal and the second connection terminal are connected reversely on condition that the detection difference is a negative value, and output the connection-enabling signal to the connection unit, to make the connection unit control the power-supply device to stop supplying the driving voltage;
determine that the power-supply device is in a low-voltage state on condition that the detection difference is a positive value and less than a detection threshold, and output the connection-enabling signal to the connection unit, to make the connection unit control the power-supply device to stop supplying the driving voltage; and
output the connection-enabling signal to the connection unit on condition that the detection difference is a positive value and greater than the detection threshold, to make the connection unit control the power-supply device to supply the driving voltage to the first connection terminal and the second connection terminal.

17. The electric device of claim 13, wherein
the detecting unit is further electrically coupled with the connection unit electrically coupled with the power-supply device, and is configured to receive the current signal outputted by the connection unit and transmit the current signal to the control unit, when the connection unit controls the power-supply device to supply the driving voltage to the first connection terminal and the second connection terminal, wherein the current signal is a current used for the power-supply device to drive the load to start running, wherein the load is electrically coupled with the first connection terminal and the second connection terminal; and
the control unit is configured to receive the current signal, compare the current signal with a current threshold, and output the connection-enabling signal to the connection unit according to a comparison result, wherein the connection-enabling signal allows to control the connection unit to control the power-supply device to supply or stop supplying the driving voltage.

18. The electric device of claim 13, wherein
the first detecting unit is configured to receive the voltage at the first connection terminal as a first identification signal, and configured to process and output the first detection signal to the control unit;
the second detecting unit is configured to receive the voltage at the second connection terminal as the second identification signal, and configured to process and output a second detection signal to the control unit; and
the second detecting unit is electrically coupled with the connection unit, and is configured to receive the current signal outputted by the connection unit and output the current signal to the control unit, when the connection unit controls the power-supply device to supply the driving voltage to the first connection terminal and the second connection terminal.

19. The electric device of claim 13, wherein the switch identification circuit further comprises a battery unit, wherein
the battery unit is electrically coupled with the first connection terminal, and is configured to maintain the voltage at the first connection terminal such that there is a voltage difference between the voltage at the first connection terminal and the voltage at the second connection terminal; and
the battery unit is further electrically coupled with the connection unit, and is configured to output or stop outputting the driving voltage to the first connection terminal and the second connection terminal, under control of the connection unit.

20. The electric device of claim 13, wherein
the identification unit is electrically coupled with the first connection terminal and the second connection terminal, and is configured to provide a conductive loop when the first connection terminal and the second connection terminal are short-circuited.

* * * * *